(12) United States Patent
Lu et al.

(10) Patent No.: US 7,678,709 B1
(45) Date of Patent: Mar. 16, 2010

(54) METHOD OF FORMING LOW-TEMPERATURE CONFORMAL DIELECTRIC FILMS

(75) Inventors: Brian Lu, Fremont, CA (US); Wai-Fan Yau, Los Altos, CA (US); Collin Mui, Mountain View, CA (US); Bunsen Nie, Fremont, CA (US); Raihan Tarafdar, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 129 days.

(21) Appl. No.: 11/881,005

(22) Filed: Jul. 24, 2007

(51) Int. Cl.
*H01L 21/31* (2006.01)
*H01L 21/469* (2006.01)
(52) U.S. Cl. .................. 438/769; 257/703; 257/752
(58) Field of Classification Search .................. None
See application file for complete search history.

(56) References Cited

U.S. PATENT DOCUMENTS

| | | | | |
|---|---|---|---|---|
| 6,090,442 | A * | 7/2000 | Klaus et al. | 427/255.15 |
| 6,479,404 | B1 * | 11/2002 | Steigerwald et al. | 438/781 |
| 7,129,189 | B1 * | 10/2006 | Hausmann et al. | 438/778 |
| 7,135,418 | B1 | 11/2006 | Papasouliotis | |
| 7,148,155 | B1 * | 12/2006 | Tarafdar et al. | 438/778 |
| 7,202,185 | B1 * | 4/2007 | Hausmann et al. | 438/778 |
| 7,223,707 | B1 * | 5/2007 | Papasouliotis et al. | 438/800 |
| 7,297,608 | B1 * | 11/2007 | Papasouliotis et al. | 438/404 |
| 2002/0018849 | A1 * | 2/2002 | George et al. | 427/255.27 |
| 2005/0118814 | A1 * | 6/2005 | Kim et al. | 438/689 |
| 2008/0113096 | A1 * | 5/2008 | Mahajani | 427/250 |
| 2008/0241358 | A1 * | 10/2008 | Joe et al. | 427/96.8 |

OTHER PUBLICATIONS

Hausmann et al., Science, Rapid Vapor Deposition of Highly Conformal Silica Nanolaminates, vol. 298, pp. 402-406, 2002.*
http://www.merriam-webster.com/dictionary/catalyst.*
George Papasouliotis, U.S. Appl. No. 11/318,268, filed Dec. 23, 2005.

* cited by examiner

*Primary Examiner*—Ha Tran T Nguyen
*Assistant Examiner*—Shantanu C Pathak
(74) *Attorney, Agent, or Firm*—Weaver Austin Villeneuve & Sampson LLP

(57) ABSTRACT

A deposition method modulates the reaction rate and thickness of highly conformal dielectric films deposited by forming a saturated catalytic layer on the surface and then exposing the surface to silicon-containing precursor gas and a reaction modulator, which may accelerate or quench the reaction. The modulator may be added before, after, or during exposure of the silicon-containing precursor gas. The film thickness after one cycle of deposition may be increased up to 20 times or decreased up to 20 times.

19 Claims, 5 Drawing Sheets

METHOD OF FORMING LOW-TEMPERATURE CONFORMAL DIELECTRIC FILMS

FIELD OF INVENTION

This invention relates to semiconductor wafer processing technology. Specifically, it relates to methods of forming dielectric films. Even more specifically, it relates to methods of depositing a conformal dielectric film with a high degree of surface smoothness.

BACKGROUND OF THE INVENTION

Conformal, uniform dielectric films have many applications in semiconductor manufacturing. In the fabrication of sub-micron integrated circuits (ICs) several layers of dielectric film are deposited. Four such layers are shallow trench isolation (STI), pre-metal dielectric (PMD), inter-metal dielectric (IMD) and inter-layer dielectric (ILD). Other applications of conformal dielectric films may be as passivation layers, sacrificial or permanent spacer layers, sacrificial or permanent storage node separation layers, or as dielectric liners for through-wafer vias. These layers require silicon dioxide or other dielectric films that fill features of various sizes and have high conformality and uniform film thicknesses across the substrate.

Additionally, challenges associated with shrinking device footprints, increased interconnections, and higher thermal and power loads have created an opportunity for through-wafer vias. New wafer-level packaging technology has evolved from conventional IC interconnect fabrication to the use of through-wafer vias in three-dimensional (3-D) stacked chip packages. Previously, most stacked devices were interconnected by wire bonding at the periphery of the chips. Now, through-wafer vias serve as an electrical connection between stacked chips, analogous to the role of electrical interconnects within an IC. In most embodiments, deep vias are etched through the Si substrate of each device, lined with an insulating material, coated with a diffusion barrier, and filled with a conducting metal. The vias have diameters of approximately 100 um or less and depths of up to 700 um, resulting in high-aspect ratio features that require a highly conformal dielectric film to form a continuous insulating liner in the via.

Other recent and developing applications for conformal, uniform dielectric films are as sacrificial layers in various steps of IC fabrication. A sacrificial layer may be used as a mask for subsequent etching and/or deposition steps, for which a highly uniform film is required. Sacrificial layers may also serve as structural materials during IC fabrication, to be removed following particular processing steps. These applications may require specific film properties relating to conformality, within-wafer uniformity, wet etch rate, mechanical strength, hardness, dielectric constant, leakage, and breakdown field.

In some applications, the dielectric deposition must take place on a substrate also comprising temperature-sensitive materials with reduced thermal budgets. In that case, the surface preparation, dielectric deposition, and post-deposition treatments must occur at maximum temperatures that may not exceed approximately 200 degrees Celsius, and less than about 100 degrees Celsius in some embodiments.

Chemical vapor deposition (CVD) has traditionally been the method of choice for depositing silicon dioxide films. However, as design rules continue to shrink, the aspect ratios (depth to width) of features increase, and traditional CVD techniques can no longer provide void-free gap-fill in these high aspect ratio features.

An alternative to CVD is atomic layer deposition (ALD). ALD methods involve cycling of self-limiting adsorption/reaction steps of reactant gases and can provide thin, conformal films within high aspect ratio features. The ALD process involves exposing a substrate to alternating doses of, usually two, reactant gases. As an example, if reactants A and B are first and second reactant gases for an ALD process, after A is adsorbed onto the substrate surface to form a saturated layer, B is introduced and reacts only with adsorbed A. In this manner, a very thin and conformal film can be deposited. One drawback, however, to ALD is that the deposition rates are very low. Films produced by an ALD cycle are very thin (i.e., about one monolayer); therefore, numerous ALD cycles must be repeated to adequately fill a gap feature. These processes are unacceptably slow in some applications in the manufacturing environment.

Another more recently developed technique useful in dielectric gap fill and other deposition applications in semiconductor processing is referred to as pulsed deposition layer (PDL) processing, sometimes also referred to as surface-catalyzed rapid vapor deposition (RVD). PDL is similar to ALD in that reactant gases are introduced alternately over the substrate surface, but in PDL the first reactant A acts as a catalyst, promoting the conversion of the second reactant B to a film. In ALD the reaction between A and B is approximately stoichiometric, meaning that a monolayer of A can only react with a similar amount of B before the film-forming reaction is complete. The catalytic nature of A in PDL allows a larger amount of B to be reacted, resulting in a thicker film that is much greater than one monolayer. Typically, up to 120 angstroms of film may be deposited in one iteration of the PDL process. Thus, PDL methods allow for faster film growth with similar film conformality to ALD methods.

SUMMARY OF THE INVENTION

The present invention provides a deposition method to modulate the reaction rate and thickness of highly conformal dielectric films deposited by pulsed deposition layer (PDL) processing. In PDL, reactant gases are introduced alternately over the substrate surface, where the first reactant A acts as a catalyst to form a catalyst-saturated surface followed by exposure of the surface to reactant B, which is a silicon-containing precursor gas. The reactant B is converted to a conformal dielectric film through catalytic reaction with reactant A. The present invention also includes adding a reaction modulator, which may accelerate or quench the reaction. The modulator may be added before, after, or during exposure to the silicon-containing precursor gas. The methods may also involve introducing multiple doses of the silicon-containing precursor and reaction modulator for each dose of the catalyst.

In one aspect, the present invention pertains to a method of depositing a dielectric film. The substrate is exposed to a catalytic precursor to form a catalytic layer on the substrate surface, exposed to a silicon-containing precursor gas and then a reaction modulator. The reaction modulator may be an accelerator that increases the film-forming reaction rate or a quencher that decreases the film-forming reaction rate. The reaction modulator may be added before, after, or during exposure to the silicon-containing precursor gas.

The catalyst is a compound that can sufficiently adsorb onto or react with the substrate surface and prepare it to react with the subsequently added silicon-containing precursor to form a dielectric layer more than a monolayer thick. In certain embodiments, the catalyst is a metal-containing precursor that may include aluminum, zirconium, hafnium, gallium, titanium, niobium, or tantalum. In certain preferred embodiments, the catalytic metal-containing precursor may be one of hexakis(dimenthylamino) aluminum or trimethyl aluminum.

In other embodiments, the catalyst is a metal and metalloid-free precursor. Potential metal-free catalysts include organic or inorganic acids, organic bases, salts, organophosphorus compounds and precursors to these. A preferred class of catalytic precursors are acidic compounds (e.g., an organic acid such as acetic acid ($CH_3COOH$) or an inorganic acid such as phosphoric acid ($H_3PO_4$)).

The silicon-containing precursor gas is preferably a silanol or silandiol. Examples are alkoxysilanol, alkyl alkoxysilanol, alkyl alkoxysilanediol or alkoxysilanediol.

In embodiments in which the reaction modulator is an accelerator, the reaction accelerator may be a halogen, halogen-containing alkane, alkene, hydrohalogen acid, ammonia, alcohol, water, organic acid, sulfuric acid, phosphate acid, or a combination thereof. The reaction accelerator may also be tetrachloro silane, trichloro alkoxy silane, dichloro dialkoxy silane, chloro trialkoxy silane, or a combination of these.

In embodiments in which the reaction modulator is a quencher, the quenching chemical may be an amine-terminated compound, or a less volatile compound that condenses on the catalyst surface. While not being bound to any particular theory, the reaction quencher is believed to chemically bind to or to physically block the catalyst on the saturated surface, preventing the catalyst from assisting in the film-forming reaction.

The reaction modulator may be premixed with the silicon-containing precursor gas at 0.1-10000 parts per million (ppm), preferably less than about 1000 parts per million. The substrate may be exposed to the reaction modulator independently of the silicon-containing precursor. The exposure to the modulator may occur before or after the exposure to the silicon-containing precursor.

One cycle of deposition includes the catalyst saturation operation, the silicon-containing precursor exposure operation, and the reaction modulator exposure operation. After one cycle using a reaction accelerator, the dielectric film formed may be at least 150 angstroms thick, preferably at least about 500 angstroms thick, even more preferably at least about 1000 angstroms thick. The rate of reaction, or the film formation rate, may be at least about 2 to 20 times greater than deposition rate without the reaction accelerator. After one cycle using a reaction quencher, the dielectric film formed may be less than about 150 angstroms thick, preferably less than about 100 angstroms thick, even more preferably less than about 50 angstroms thick. The rate of reaction, or the film formation rate, may be at least about 2 to 20 times less than deposition rate without the reaction quencher. In some embodiments, the method may include repeating the steps of exposing the substrate to the silicon-containing precursor and reaction modulator prior to any subsequent doses of metal-containing or metal-free catalyst.

The film formed using the present invention may be conformal; conformality is preferably similar to that of a dielectric film deposited without the accelerator. The methods of the present invention may be repeated until a film of desired thickness is reached. The methods of accelerating the film formation reaction decreases the number of iterations required to reach the desired thickness.

In another aspect, the present invention pertains to a method of controlling a reaction rate and thickness of dielectric film deposition by exposing the substrate surface to a reaction modulator during the PDL process wherein the reaction rate and thickness of the film deposition is controlled by the type and amount of the modulator. The reaction modulator may increase or decrease the rate and thickness of the deposited film as compared to not using the modulator. The amount of modulator used may be less than 10000 parts per million of the silicon-containing precursor gas if premixed, or equivalent amount of pure modulator compounds if exposed separately. The reaction modulator may include halogens, halogen-containing alkanes, alkenes, hydrohalogen acids, ammonia, amines, alcohol, water, organic acids, sulfuric acid, phosphate acid, or a combination thereof.

These and other aspects and advantages of the invention are described in the detailed description which follows.

DETAILED DESCRIPTION OF SPECIFIC EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

Process

Highly conformal dielectric may be deposited by using PDL processes. The dielectric may be any suitable silicon oxide-based material, doped or undoped, for example undoped silicon dioxide (undoped silica glass (USG)), boron doped silica glass (BSG), phosphorus-doped silica glass (PSG) or boron and phosphorus-doped silica glass (BPSG). In general, a layer thickness of about 50-15,000 Å or 300-1500 Å, for example about 1000 Å may be suitable, depending on the application. The formation of silica films by pulsed deposition layer (PDL) processing can be catalyzed by metal-containing or metal and metalloid-free compounds.

Figure 1:
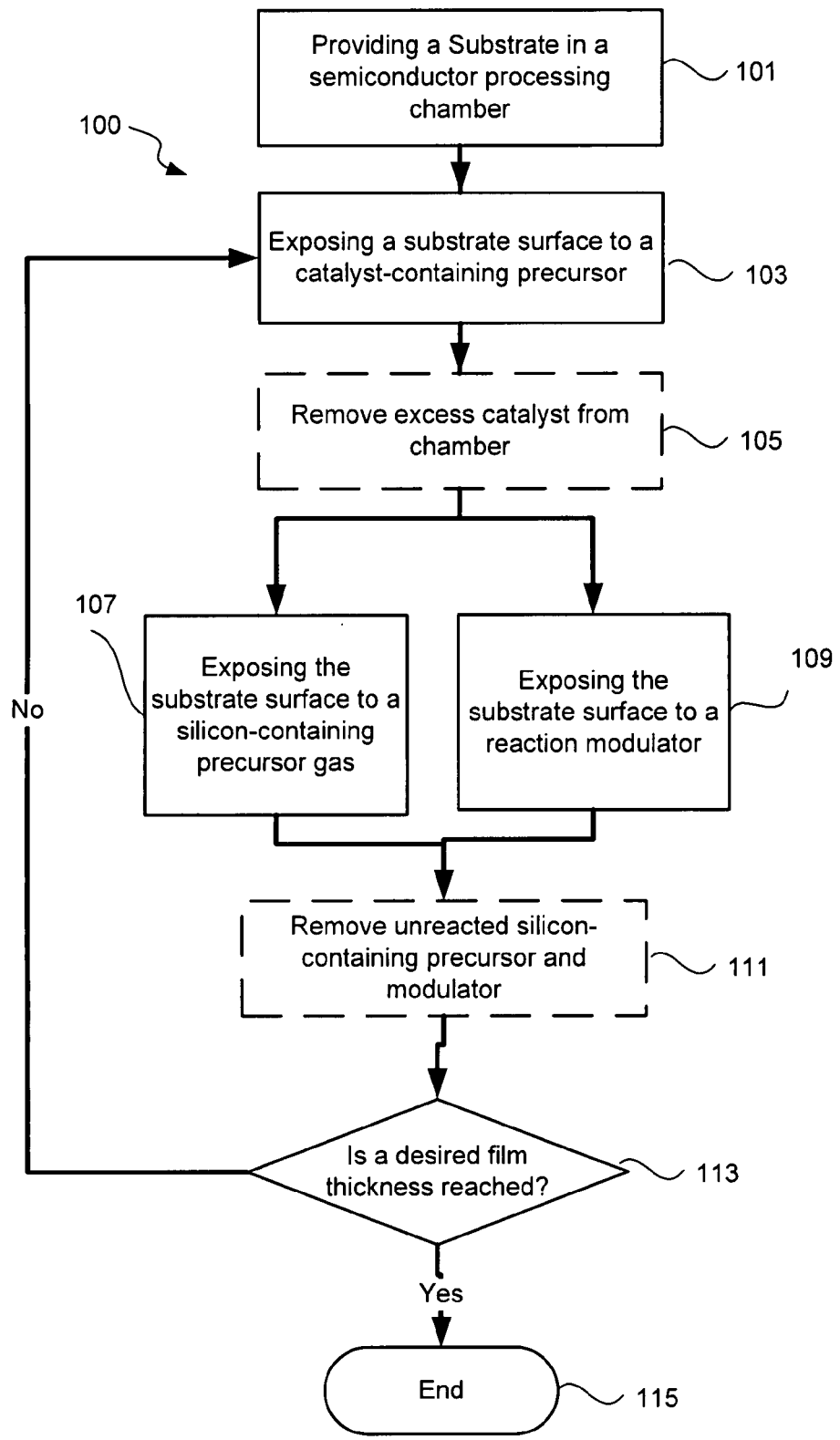
FIG. 1 is a process flow diagram illustrating operations of a deposition process in accordance with the present invention.

FIG. 1 shows a process flow diagram for a PDL process in accordance with the present invention. A pulsed deposition layer (PDL) process to form a conformal dielectric film begins with placement of a substrate into a deposition chamber 101. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, one commercially important application of the present invention is in various sacrificial or permanent spacer and separation layers. A catalyst or a catalyst precursor is supplied into the deposition chamber so as to substantially saturate the substrate surface 103. Any compound or precursor that can sufficiently adsorb onto or react with the substrate surface and prepare it to sufficiently further react with the subsequently added silicon-containing precursor may be used. In addition, the catalyst or catalyst precursor should be capable of aiding the catalytic polymerization of the subsequently added silicon-containing precursor to produce a film thicker than a monolayer.

Metal-containing compounds suitable as catalyst precursors in a PDL process include aluminum-containing compounds, in certain embodiments. In certain preferred embodiments, hexakis(dimethylamino) aluminum ($Al_2(N(CH_3)_2)_6$) or trimethylaluminum ($Al(CH_3)_3$) (TMA) may be used. Other suitable aluminum-containing precursors include, for example, triethylaluminum ($Al(CH_2CH_3)_3$) or aluminum trichloride ($AlCl_3$). Other metal-containing precursors that can catalyze the reaction include, but are not limited to, zirconium, hafnium, gallium, titanium, niobium, and tantalum.

Metal and metalloid-free compounds suitable as catalyst precursors include organic or inorganic acids such as alkyl/aryl boronic acids, sulphonic acids and anhydrides of organic acids, organic bases such as alkylamines and arylamines, salts such as ammonium salts, organophosphorus compounds such as alkyl/dialkyl phosphates, phosphonic acids, and phosphonitrile compounds and precursors to these. A preferred class of catalytic precursors are acidic compounds (e.g., an organic acid such as acetic acid ($CH_3COOH$) or an inorganic acid such as phosphoric acid ($H_3PO_4$).

Forming a catalyst layer is a self-limiting process. Relevant process conditions can include substrate (e.g., wafer) temperature, reactor pressure, reactant partial pressure, and combinations thereof, and can very widely depending upon the particular catalyst or precursor used. For a metal-containing catalyst precursor, pressures can range broadly, e.g., between about 1 mTorr and 760 Torr. Typical pressures range between about 10 mTorr and 20 Torr and typical temperatures range between about 70 and 300 degrees Celsius. Flow rates of metal-containing precursor gas can range broadly, e.g., between about 1 and 10000 sccm. Preferred flow rates of metal-containing precursor gas range between about 1 and 500 sccm. The dose of metal-containing precursor can range broadly, e.g., between about 0.1 milligrams and 10 grams. Typical metal-containing precursor doses range between about 0.001 and 0.02 grams. Exposure times suitable for forming a saturated layer are typically only seconds, e.g., about 0.01 to 10 seconds. In some embodiments, for example, an exposure time of about 0.1 seconds or 2 seconds is found to be sufficient. Given the directions and parameters provided herein, one of skill in the art will be able to readily determine the appropriate conditions for effective use of a given catalyst in accordance with the present invention.

After the catalyst layer is formed an inert gas may be preferably used to purge the substrate surface and reaction chamber 105. It should be noted that introduction of a purge gas can be used in between operations wherein contact between reactant gases should be avoided, including between each process cycle. Further, the purge gas can be flowed continuously during any of these operations and a period or periods between the operations. Purge gases are generally inert. Examples include the noble gases (e.g., helium and argon) and nitrogen. The reaction chamber may additionally be evacuated before, during or after inert gas purge. In another embodiment, instead of flowing purge gas, the substrate may be transferred to another deposition chamber for the next operation. Contact between reactant gases may be avoided if different chambers, or different stations within the same chamber, are used for each operation.

Following removal of excess catalyst, the catalyst-activated substrate surface is exposed to a silicon-containing precursor gas under conditions selected for growth of a conformal dielectric film 107. Any suitable silicon-containing precursor that can sufficiently adsorb onto and react with the catalytic layer to form a dielectric film may be used. In addition, the silicon-containing precursor should be capable of polymerization when exposed to the adsorbed catalyst to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol($(C_4H_9O)_3SiOH$), tris(tert-pentoxy)silanol($(C_5H_{11}O)_3SiOH$), di(tert-butoxy)silandiol($(C_4H_9O)_2Si(OH)_2$) and methyl di(tert-pentoxy)silanol.

Process parameters during exposure to the silicon-containing precursor gas including substrate (e.g., wafer) temperature, reactor pressure, precursor partial pressure, gas flow rates, dose and exposure times will vary depending on the types of precursors used, reaction chamber configuration, desired final film thickness, desired deposition rate and dielectric characteristics, among other variables. Generally, temperatures can range from about 50 to 300° C. A typical initial deposition temperature is between about 70 to 230° C. and between about 50 to 230° C. for subsequent deposition stages. Pressures can range broadly, e.g., between about 1 mTorr and 760 Torr. Typical pressures range between about 10 mTorr and 20 Torr.

Doses of silicon-containing precursor gas can range broadly, e.g., between about 0.01 milligrams and 10 grams. Preferred flow rates of silicon-containing precursor gas range between about 1 milligrams and 0.2 grams. Exposure times can range broadly, e.g., between about 1 millisecond and 200 seconds. Preferred exposure times typically range between about 2 and 60 seconds. The number of separate exposures to silicon-containing precursor will primarily depend upon the desired final film thickness. Typical numbers of silicon-containing precursor exposure cycles for a STI feature 0.1 micron in diameter range between about 2 and 4. Again, as with the temperature process condition, these other process conditions may be modulated alone or in combinations in the dynamic process of the invention in accordance with the parameters noted above.

While the invention is not limited to this theory of operation, as mentioned previously, it is believed that the catalyst is adsorbed onto or reacts with the substrate surface. The initial growth of silicon oxide is achieved through the reaction of silanol vapor with the catalyst on the substrate surface, which releases by-products to the gas phase. The by-products in the gas phase, which may include water, may react further with silanol leading to hydrolysis of silanol. The hydrolyzed silanol and partially hydrolyzed intermediates are then deposited on the substrate. The hydrolyzed surface species then cross-link and form silicon oxide. Thus, dielectric layers more than one monolayer thick, up to about 150 angstroms, may be deposited in one cycle of catalyst saturation and silicon-containing precursor gas exposure operations.

Before, during, or after the exposing operation of the substrate to the silicon-containing precursor gas 107, the substrate is also exposed to a reaction modulator 109. The reaction modulator may increase (accelerate) or decrease (quench) the thickness of dielectric film deposited and the rate of reaction. When using an accelerator, film thickness may be increased 2, 3, 4, 5 6, or by up to as much as 10 fold or more, for example, from 125 angstroms up to 1200 angstroms per cycle. The duration of each cycle may be about the same or slightly greater, up to about 25% longer. Thus, the rate of reaction is greatly increased because the thickness per cycle increases up to 10 times with little or no change in reaction duration. Film thickness may also be decreased 10%, 25%, by as much as 50% or more, for example from 125 angstroms down to less than 50 angstroms per cycle, by using reaction quenchers that decreases the thickness and rate of reaction. The film formed using the quencher may be conformal, similar to that of a dielectric film deposited without the modulator. Thus, the use of reaction quenchers forms a highly conformal and thin film not otherwise achieved by using a process without a quencher.

A reaction modulator may be a halogen, halogen-containing alkane, alkene, hydrohalogen acid, amine, ammonia, alcohol, water, organic acid, sulfuric acid, phosphate acid, and a combination thereof. In a particular instance, a reaction accelerator may be tetrachloro silane, trichloro alkoxy silane, dichloro dialkoxy silane, chloro trialkoxy silane, or a combination of these. In another particular instance, a reaction quencher may be an amine-terminated organic molecule, which can strongly bind to the catalytic sites and prevent access of the silicon-containing molecules to these sites. A reaction quencher may also be a less-volatile compound that condenses on the catalyst surface and physically blocks reactions of silicon-containing molecules from reaching the catalytic sites.

If applied during the exposing of silicon-containing precursor gas operation 107, the reaction modulator may be mixed with the silicon-containing precursor gas. In some embodiments, the silicon-containing precursor and reaction modulator may be mixed in the same chemical ampoule. In other embodiments, the mixing may occur during delivery to the chamber, for example, in a vaporizer, mixing bowl or showerhead. The concentration of the reaction modulator may be 0.1-10000 parts per million of the silicon-containing precursor gas. In some embodiments, the modulator may be less than 1000 parts per million. The reaction modulator may also be applied before or after the silicon-containing precursor in separate operations.

While the invention is not limited to this theory of operation, it is believed that an accelerating reaction modulator enhances the hydrolysis process described above. The hydrolysis increases the deposition rate in the second deposition stage after the initial growth of silicon oxide. The reaction accelerator may be produced as a by-product of the initial growth reaction, but can also be added separately. It is believed that the reaction accelerator reacts with silanol to form hydrolyzed silanol and partially hydrolyzed intermediaries, which then deposit onto the substrate surface. It is also believed the catalyst may not participate in the second deposition stage to hydrolyze silanol. The quenching reaction modulator, on the other hand, may work by binding to or by physically blocking the catalyst to inhibit the catalysis reaction with silanol in forming the initial film. By reducing the initial growth, less by-products are formed to hydrolyze silanol in the second stage deposition. Thus, the total film formed is less and the reaction rate is also reduced.

After one cycle of the PDL process, the chamber may be again purged to remove unreacted silicon-containing precursor and modulator 111 before the next operation. Alternatively, the substrate may be transferred to the next chamber or station for further processing. The catalyst, silicon-containing precursor, and reaction modulator exposures may be repeated a number of times, for example a total of 2-10 times, to build up a silica film forming the completed dielectric film 113. For example, the operations might be repeated until a gap is filled by the deposited dielectric. In some embodiments, the method may include repeating the steps of exposing the substrate to the silicon-containing precursor and reaction modulator prior to any subsequent doses of metal-containing or metal-free catalyst. The operations of exposing the substrate to the catalyst and the silicon-containing precursor can be carried out in a single chamber, or in separate reactor chambers. When using a reaction accelerator, the present invention deposits a thicker film per cycle and has the advantages of increasing throughput by reducing the total number of cycles required for a desired thickness. When using a reaction quencher, the present invention deposits a thinner film per cycle and has the advantages of providing finer control when depositing low film thicknesses. Depending on the targeted type of application and structure, it may even be desirable to use a reaction accelerator for an initial one or more cycles to quickly deposit a thick film and then use a reaction quencher for the final one or more cycles to provide tight control of the final film thickness.

The process operations can be carried out in situ in the same chamber, in an integrated tool, on separate stations within the same chamber, or in separate chambers (with or without a vacuum break). Some sample apparatus for implementing the invention are described below. While the apparatus described below relates to PDL, it should be understood that these are just examples of deposition techniques suitable for implementation of the present invention. Several other deposition techniques, and associated apparatus, examples of which are known in the art, may alternatively be used.

Figure 2:
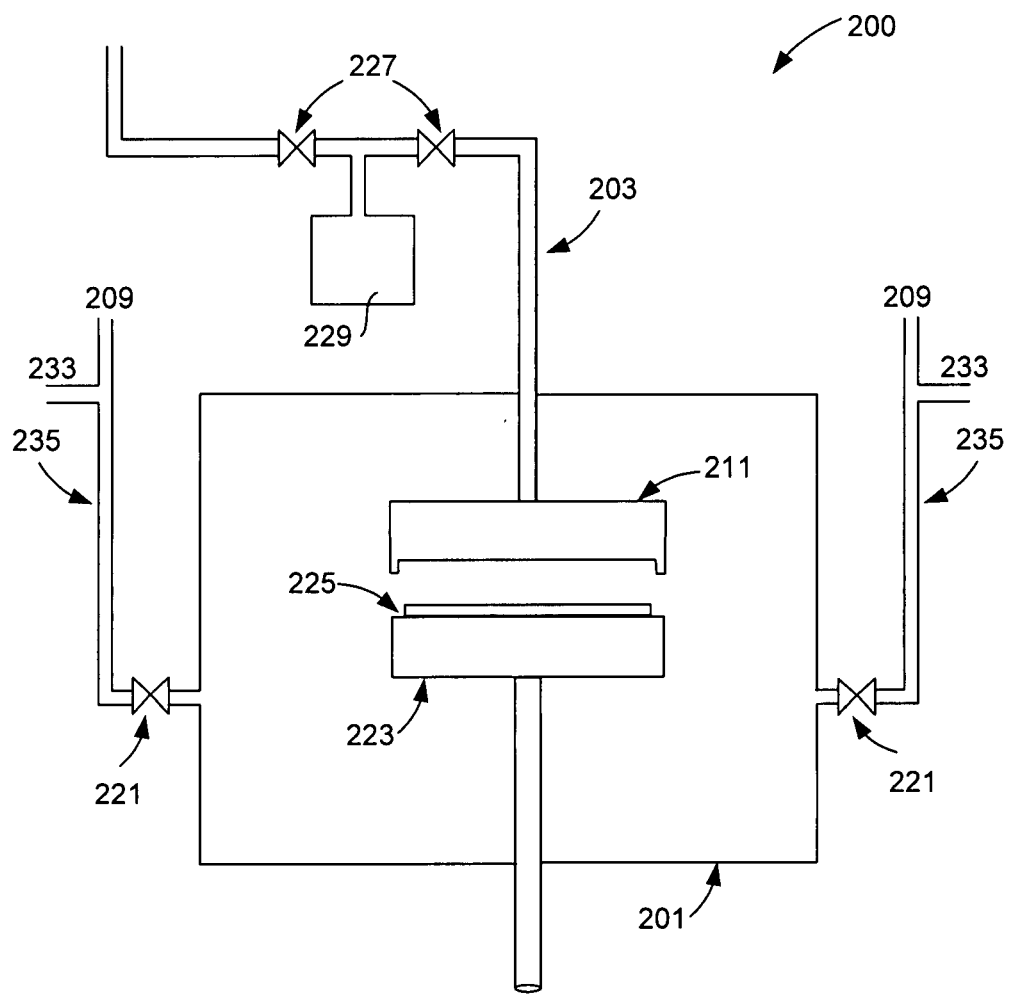
FIG. 2 is a schematic diagram showing the basic features of a PDL reactor module suitable for depositing silicon-based dielectric in accordance with the present invention.

FIG. 2 is a schematic diagram depicting some components of a suitable reactor for performing dielectric deposition using a PDL process in accordance with one embodiment of this invention. Note that this apparatus is only an example of suitable apparatus for deposition in accordance with this embodiment of the present invention. Many other apparatuses and systems, including a multi-chambered and/or multi-station apparatus, may be used.

As shown, a reactor 200 includes a process chamber 201, which encloses components of the reactor and serves to contain the reactant gases and provide an area to introduce the reactant gases to substrate 225. The chamber walls may be made of or plated with any suitable material, generally a metal that is compatible with the deposition and associated processes conducted therein. In one example, the process chamber walls are made from aluminum. In another example, the process chamber is made from or coated with aluminum oxide. Within the process chamber, a wafer pedestal 223 supports a substrate 225. The wafer pedestal 223 may be raised or lowered relative to a showerhead module 211, which may also move. The pedestal 225 typically includes a chuck to hold the substrate in place during the deposition reaction. The chuck may be an electrostatic chuck, a mechanical chuck, a vacuum chuck or various other types of chuck as are available for use in the industry and/or research. A heat transfer subsystem may include resistive heaters and/or lines for supplying a heat transfer fluid to the pedestal 223 for controlling the temperature of pedestal 223. In some embodiments, the heat transfer fluid comprises water or another liquid.

Reactant material gases are introduced into the chamber via gas lines 203. A showerhead 211 may be used to distribute the gas flow uniformly above the substrate. Each gas line may have a corresponding accumulator 229 that can be isolated from the apparatus using isolation valves 227. Note that the apparatus may be modified to have one or more lines with its isolation valves and accumulators, depending on the number of reactant gases used. Also reactant gas delivery lines may be shared between multiple stations.

The chamber is evacuated through vacuum lines 235 that are connected to a vacuum source 209 though a plurality of valves 221. The vacuum source may be a vacuum pump. In multi-station reactors, particularly those having multiple stations that perform the same deposition process, a vacuum line from another station 233 may share a common foreline with the vacuum line 235. Note that the apparatus may be modified to have one or more vacuum lines per station or chamber.

Figure 3:
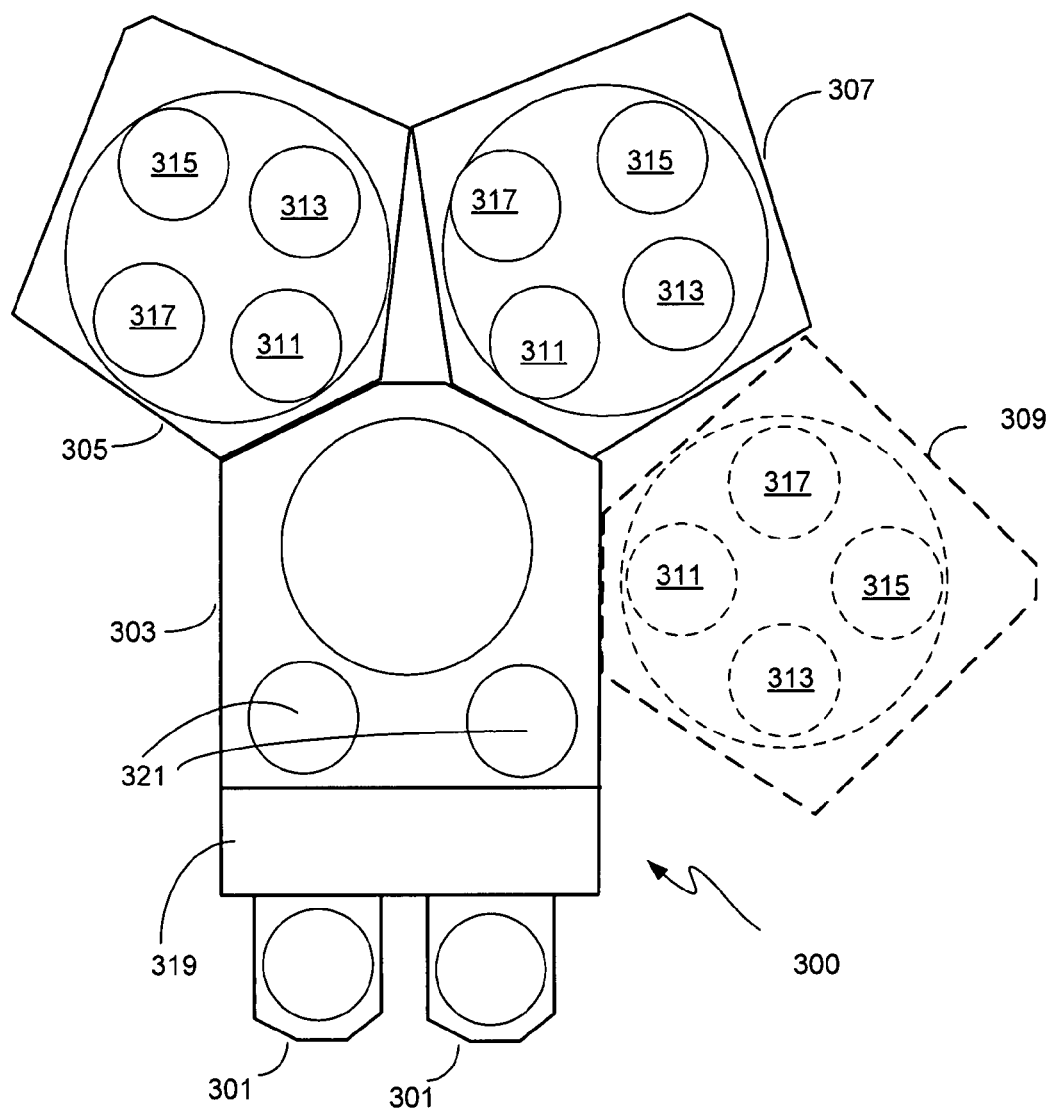
FIG. 3 shows a semiconductor processing tool having multiple chambers and optionally multiple stations within these chambers suitable for implementation of the present invention.

In some embodiments, these stations or chambers may be deployed on a semiconductor processing tool having multiple chambers and optionally multiple stations within these chambers. An example of such processing tool is shown in FIG. 3. The semiconductor processing tool 300 includes multiple chambers, e.g., 305, 307, and optionally 309. Each of these chambers includes multiple stations, e.g., four stations 311, 313, 315, and 317. In some embodiments, only two chambers or even one chamber may be included on the tool. Every chamber is coupled to a transfer chamber 303, containing a transfer robot (not shown), and load locks 321, which may cool or heat the substrates before or after processing. The substrates enter the system via loading stations 301, which may be front opening unified pods (FOUPs). The substrates are individually removed from the FOUP into the atmospheric chamber 319 by an atmospheric robot (not shown) to one of two load locks 321. From the load locks 321 and transfer robot transfers the substrates to the processing chambers 305, 307, or 309.

Different process parameters may be used at each of the four stations in the PDL chambers. For example, at station 311 a PDL process without reaction modulators may be used to deposit a conformal film. At the next station 313, a thicker film may be deposited using the accelerator to achieve a film thickness in the range of a desired thickness. At the last stations 315 and 317, a PDL process may fine tune the thickness or film properties by use a reaction quencher to deposit a thin conformal layer with desired film properties. Thus, different reactants may be delivered to stations in the same chamber.

In other embodiments, each of the stations may deposit using the same process parameters or reactants. Various details of the apparatus have been omitted for clarity's sake, and various design alternatives may be implemented.

EXAMPLE

The following example provides details relating to performance advantages of the present invention. It should be understood the following is representative only, and that the invention is not limited by the detail set forth in this example.

The method of the invention was implemented by a PDL process using trimethylaluminum (Al(CH$_3$)$_3$) (TMA) as a metal-containing catalyst and tris(tert-pentoxy)silanol ((C$_5$H$_{11}$O)$_3$SiOH; TPOSL; MW=306) as the silicon-containing precursor. In one case, the TPOSL precursor included one percent (1%) reaction accelerator, which is believed to be a chloro alkoxy silane, and in another case, the TPOSL precursor did not include a reaction accelerator.

Figure 4:
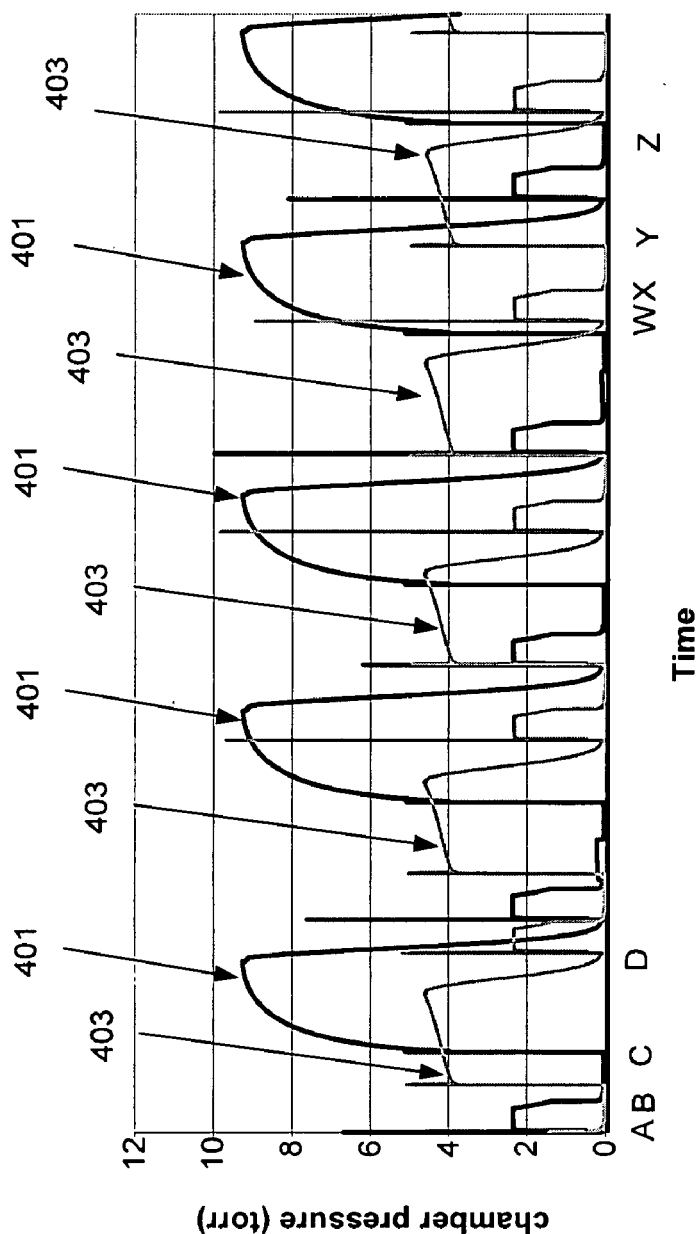
FIG. 4 is a graph of chamber pressures over several cycles of deposition with and without a reaction accelerator.

FIG. 4 is a plot of the chamber pressure over time for both cases. The chamber pressure for deposition including a reaction accelerator is shown as line 401. The chamber pressure for deposition not including a reaction accelerator is shown as line 403. Referring to line 401 at the beginning of the first cycle (time "A"), the metal-containing catalyst is injected into the chamber, causing the pressure to rise to about 2.5 Torr initially. The pressure reduces slightly as the catalyst is adsorbed onto the surface of the substrate. Then the chamber is purged and evacuated by opening the vacuum valves, causing the pressure to reduce to almost zero (time "B"). Then the accelerator and silicon-containing precursor gas is injected at time "C", causing the pressure to increase. As discussed above, initially the silanol reacts with the adsorbed catalyst on the surface of the substrate to form an initial layer of silicon dioxide. This initial reaction forms by-product gases which accumulate in the chamber and cause the chamber pressure to increase. Some of the by-product gases further react with the silanol vapor to form hydrolyzed silanol and partially-hydrolyzed silanol intermediaries, which also deposit onto the substrate. The pressure increase slows as some of the by-product gases are used up and the reaction slows down. At about time "D", the chamber is again purged and/or evacuated and the pressure reduces down to nearly zero before the next cycle of deposition starts. Note that the plot shows several cycles of depositions and the chamber pressure for line 401 through several cycles are relatively consistent. Note also that an initial spike in pressure was measured in each cycle. This initial pressure spike does not reflect the pressure in the chamber as it is an instantaneous pressure increase as gas is delivered to the chamber, measured by the manometer, which is in the path of the gas delivery before the gas reaches the chamber.

A similar chamber pressure profile is generated for the case where TPOSL without the reaction accelerator is used. Referring to line 403 at a different part of the plot, at time "W" the metal-containing catalyst is injected in the chamber and it is adsorbed onto the surface of the substrate. Then the chamber is purged and/or evacuated to remove the catalyst precursors that have not been adsorbed, causing the pressure to reduce, at time "X". After the chamber is purged and/or evacuated, the pressure increases again when the silicon-containing precursor, TPOSL, is introduced to start the film forming reactions, at time "Y". The pressure builds as the reaction ensues, and then at time "Z" the chamber is again evacuated and/or purged before the next cycle of deposition starts.

Note that the plot shows several cycles of depositions and the chamber pressure for lines 403 and 401 through several cycles are relatively consistent. ". Note that the chamber pressure during TPOSL exposure rises to about 9.5 Torr for line 403, while rising to about 4.5 Torr for line 401. This increased chamber pressure indicates that more by-product gases were being formed with the addition of the accelerator and therefore more second stage deposition was occurring. Note also that the pressures at times "A" and "B" and times "W" and "X" are very similar. The similarity indicates that the addition of the accelerator to the TPOSL causes no difference during the catalyst saturation operation. Because the only difference between the two depositions is the accelerator added to the silicon-containing precursor, the plot shows increased reaction and hence film deposition with the accelerator. The film thicknesses are shown in the following table.

| TPOSL + 1% Accelerator | | | Pure TPOSL | | |
|---|---|---|---|---|---|
| Total Thickness | Per Cycle | NU % | Total Thickness | Per Cycle | NU % |
| 10603 | 530 | 5.08 | 1783 | 89 | 6.26 |
| 10646 | 532 | 5.15 | 1901 | 95 | 7.69 |
| 10742 | 537 | 5.19 | 1763 | 88 | 6.54 |
| 10737 | 537 | 4.91 | 1884 | 94 | 7.16 |

The table shows that over 20 deposition cycles, the per cycle thickness and the total thickness were consistently about six times greater with the accelerator as compared to thickness without. FIG. 4 shows the duration of the cycles. The cycle duration with the accelerator is slightly longer, up to about 25% longer, but the film deposited is 6 times thicker using the same amount of reactant chemicals.

Figure 5:
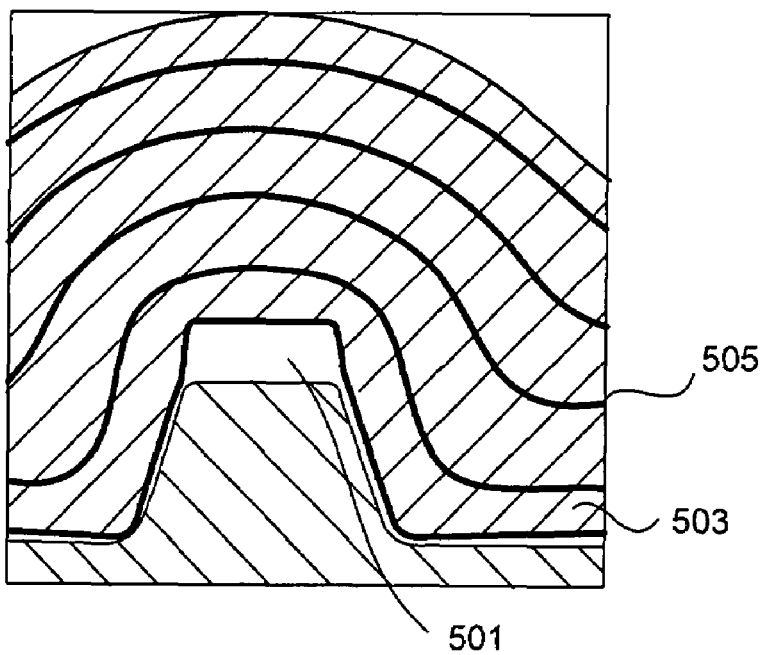
FIG. 5 is an illustration of the side profile of dielectric films deposited using methods in accordance with the present invention.

FIG. 5 illustrates the film deposited using the example process. Layer 503 is deposited over features 501 in a conformal way. Layers 503 are deposited successively with the interface 505, which is a layer of TMA catalyst. The thickness between TMA layers mark the thickness of SiO$_2$ formed during each deposition cycle. SEM image data found film thicknesses of each layer 503 to vary from 100 up to 1200 angstroms depending on the deposition temperature, dose of silicon-containing compound, and the accelerator concentration. The 1200 angstroms per cycle deposition rate was achieved at 200° C., 200 micro-moles of silicon-containing precursor, and 60 second of deposition time.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and chemical reactants of the present invention. For example, while the invention has been described primarily with reference to a metal-containing catalyst, it is not so limited. Other known metal or metalloid-free catalyst forming appropriate by-product gases may be used. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

It is claimed:

1. A method of forming a dielectric film, the method comprising:
   (a) exposing a substrate surface to a catalyst to form an adsorbed layer on the substrate surface, wherein said catalyst is a metal-free catalyst selected from the group consisting of alkyl/aryl boronic acids, sulphonic acids, alkylamines, arylamines, ammonium salts, alkyl/dialkyl phosphates, phosphonic acids, and phosphonitrile compounds;
   (b) exposing the substrate surface to a silicon-containing precursor gas; and
   (c) exposing the substrate surface to a reaction accelerator, wherein the reaction accelerator is

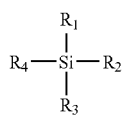

and wherein R$_1$, R$_2$, R$_3$, R$_4$ are independently selected from the group consisting of halogens, alkyls, alkoxy groups, halogen-containing alkanes, alkenes, hydrohalogen acids, ammonia, alcohol, water, organic acids, sulfuric acid, and phosphate acid groups;

wherein exposure of the substrate to the reaction accelerator increases the film formation rate.

2. The method of claim 1, wherein the silicon-containing precursor gas is at least one of a silanol or silanediol.

3. The method of claim 2, wherein the silanol and a silanediol is at least one of an alkoxysilanol, alkyl alkoxysilanol, alkyl alkoxysilanediol or alkoxysilanediol.

4. The method of claim 1, wherein at least one of R$_1$, R$_2$, R$_3$, R$_4$ is a halogen.

5. The method of claim 4, wherein the halogen is chlorine.

6. The method of claim 1, wherein the exposing to accelerator step occurs before or after the exposing to silicon-containing precursor gas step.

7. The method of claim 1, wherein the film formation rate is at least about 3-10 times greater than a film formation rate of a film formed without the reaction accelerator.

8. The method of claim 1, wherein the film conformality is not degraded by addition of the reaction accelerator.

9. The method of claim 1, further comprising repeating (a) and (b) at least once.

10. The method of claim 1, wherein the silicon-containing precursor comprises a silane.

11. A method of forming a dielectric film, the method comprising:
    (a) exposing a substrate surface to a catalyst to form an adsorbed layer on the substrate surface, wherein said catalyst is a metal-free catalyst selected from the group consisting of alkyl/aryl boronic acids, sulphonic acids, alkylamines, arylamines, ammonium salts, alkyl/dialkyl phosphates, phosphonic acids, and phosphonitrile compounds;
    (b) exposing the substrate surface to a silicon-containing precursor gas; and
    (c) exposing the substrate surface to a reaction accelerator; and
    repeating (b) and (c) at least once before repeating (a).

12. A method of forming a dielectric film, the method comprising:
    (a) exposing a substrate surface to a catalyst to form an adsorbed layer on the substrate surface;
    (b) exposing the substrate surface to a silicon-containing precursor gas;
    (c) exposing the substrate surface to a reaction accelerator, wherein said reaction accelerator is a chemical selected from the group consisting of halogens, halogen-containing alkanes, alkenes, hydrohalogen acids, ammonia, alcohol, water, organic acids, sulfuric acid, phosphate acid, and a combination thereof, wherein said reaction accelerator is a chlorine-containing chemical; and
    wherein exposure of the substrate to the reaction accelerator increases the film formation rate.

13. The method of claim 12, wherein the catalyst is a metal-containing precursor that can sufficiently adsorb onto or react with the substrate surface and prepare it to react with the subsequently added silicon-containing precursor to form a dielectric layer more than a monolayer thick.

14. The method of claim 13, wherein the metal-containing precursor comprises a metal selected from the group consisting of aluminum, zirconium, hafnium, gallium, titanium, niobium, and tantalum.

15. The method of claim 13, wherein the metal-containing precursor is hexakis(dimenthylamino) aluminum or trimethyl aluminum.

16. The method of claim 12, wherein the exposing to accelerator step occurs before or after the exposing to silicon-containing precursor gas step.

17. The method of claim 12, wherein the silicon-containing precursor comprises a silane.

18. The method of claim 12, wherein the accelerator is mixed with the silicon-containing precursor gas at 0.1-10000 parts per million.

19. A method of forming a dielectric film, the method comprising:
   (a) exposing a substrate surface to a catalyst to form an adsorbed layer on the substrate surface;
   (b) exposing the substrate surface to a silicon-containing precursor gas;
   (c) exposing the substrate surface to a reaction accelerator, wherein said reaction accelerator is a halogen-containing or ammonia-containing chemical selected from the group consisting of halogens, halogen-containing alkanes, alkenes, hydrohalogen acids, ammonia, alcohol, water, organic acids, sulfuric acid, phosphate acid, and a combination thereof; and
   (d) repeating (b) and (c) at least once before repeating (a); wherein exposure of the substrate to the reaction accelerator increases the film formation rate.

* * * * *